US012183509B2

(12) United States Patent
Rapoport et al.

(10) Patent No.: US 12,183,509 B2
(45) Date of Patent: Dec. 31, 2024

(54) SYSTEM FOR GENERATING A MAGNETIC FIELD

(71) Applicant: Aspect Imaging Ltd., Shoham (IL)

(72) Inventors: Uri Rapoport, Moshav Ben Shemen (IL); Yoram Cohen, Yarkona (IL); Yair Goldfarb, Ness Ziona (IL)

(73) Assignee: ASPECT IMAGING LTD., Shoham (IL)

( * ) Notice: Subject to any disclaimer, the term of this patent is extended or adjusted under 35 U.S.C. 154(b) by 0 days.

(21) Appl. No.: 18/525,283

(22) Filed: Nov. 30, 2023

(65) Prior Publication Data

US 2024/0296983 A1 Sep. 5, 2024

Related U.S. Application Data

(63) Continuation of application No. 17/103,534, filed on Nov. 24, 2020, now Pat. No. 11,887,778, which is a
(Continued)

(51) Int. Cl.
*H01F 7/02* (2006.01)

(52) U.S. Cl.
CPC .............. *H01F 7/0278* (2013.01); *H01F 7/02* (2013.01); *H01F 7/0205* (2013.01); *H01F 7/021* (2013.01);
(Continued)

(58) Field of Classification Search
CPC .......... H01F 7/02; H01F 7/0205; H01F 7/021; H01F 7/0215; H01F 7/0221;
(Continued)

(56) References Cited

U.S. PATENT DOCUMENTS

| 3,534,251 A | 10/1970 | Richards |
| 4,008,388 A | 2/1977 | McLafferty |
| (Continued) | | |

FOREIGN PATENT DOCUMENTS

| CA | 2863080 | 8/2013 |
| CN | 102136337 | 7/2011 |
| (Continued) | | |

OTHER PUBLICATIONS

Belov, A et al. Passive Shimming of the Superconducting Magnet for MRI, IEEE Transactions on Applied Superconductivity, Jun. 1995, vol. 5, No. 2, 679-681.
(Continued)

*Primary Examiner* — Mohamad A Musleh
(74) *Attorney, Agent, or Firm* — LOEB & LOEB LLP (57) ABSTRACT

Generally, a system for generating a magnetic field having a desired magnetic field strength and/or a desired magnetic field direction is provided. The system can include a plurality of magnetic segments and/or a plurality of ferromagnetic segments. Each magnetic segment can be positioned adjacent to at least one of the plurality of magnetic segments. Each ferromagnetic segment can be positioned adjacent to at least one of the plurality of magnetic segments. In various embodiments, a size, shape, positioning and/or number of magnetic segments and/or ferromagnetic segments in the system, as well as a magnetization direction of the magnetic segments can be predetermined based on, for example, predetermined parameters of the system (e.g., a desired magnetic field strength, direction and/or uniformity of the magnetic field, a desired elimination of a magnetic fringe field and/or total weight of the system) and/or based on a desired application of the system (e.g., performing a magnetic resonance imaging of at least a portion of a patient
(Continued)

and/or performing a magnetic resonance spectroscopy of a sample).

30 Claims, 5 Drawing Sheets

Related U.S. Application Data continuation of application No. 15/645,568, filed on Jul. 10, 2017, now Pat. No. 10,847,294.

(52) U.S. Cl.
CPC ......... *H01F 7/0221* (2013.01); *H01F 7/0226* (2013.01); *H01F 7/0231* (2013.01); *H01F 7/0242* (2013.01); *H01F 7/0215* (2013.01); *H01F 7/0236* (2013.01)

(58) Field of Classification Search
CPC .... H01F 7/0226; H01F 7/0231; H01F 7/0236; H01F 7/0242; H01F 7/0278
See application file for complete search history.

(56) References Cited

U.S. PATENT DOCUMENTS

| | | | |
|---|---|---|---|
| 4,536,230 A | | 8/1985 | Landa |
| 4,612,505 A | | 9/1986 | Zijlstra |
| 4,698,611 A | | 10/1987 | Vermilyea |
| 4,758,813 A | | 7/1988 | Holsinger |
| 4,899,109 A | | 2/1990 | Tropp |
| 4,931,733 A | | 6/1990 | Hanawa |
| 5,235,284 A | | 8/1993 | Tahara |
| 5,343,151 A | | 8/1994 | Cory |
| 5,359,310 A | | 10/1994 | Pissanetzky |
| 5,539,316 A | | 7/1996 | Sukumar |
| 5,565,834 A | | 10/1996 | Hanley |
| 5,635,889 A | | 6/1997 | Stelter |
| 5,664,569 A | | 9/1997 | Damadian |
| 5,760,585 A | | 6/1998 | Dorri |
| 5,959,454 A | | 9/1999 | Westphal |
| 6,081,120 A | | 6/2000 | Shen |
| 6,147,578 A | | 11/2000 | Panfil |
| 6,157,278 A | | 12/2000 | Katznelson |
| 6,177,795 B1 | | 1/2001 | Zhu |
| 6,191,584 B1 | | 2/2001 | Trequattrini |
| 6,411,187 B1 | | 6/2002 | Rotem |
| 6,452,388 B1 | | 9/2002 | Reiderman |
| 6,452,472 B1 | | 9/2002 | Aoki |
| 6,535,092 B1 | | 3/2003 | Hurley |
| 6,600,401 B2 | | 7/2003 | Zuk |
| 6,646,530 B2 | | 11/2003 | Manfred |
| 6,664,878 B1 | | 12/2003 | Chen |
| 6,687,526 B2 | | 2/2004 | Brand |
| 6,707,363 B1 | | 3/2004 | Abele |
| 6,751,496 B2 | | 6/2004 | Su |
| 6,838,964 B1 | | 1/2005 | Knight |
| 6,897,750 B2 | | 5/2005 | Neuberth |
| 6,946,939 B2 | | 9/2005 | Doi |
| 7,034,530 B2 | | 4/2006 | Ahluwalia |
| 7,071,694 B1 | | 7/2006 | Kruip |
| 7,116,198 B1 | | 10/2006 | Abele |
| 7,148,689 B2 | | 12/2006 | Huang |
| 7,199,689 B1 | | 4/2007 | Abele |
| 7,205,764 B1 | | 4/2007 | Anderson |
| 7,400,147 B2 | | 7/2008 | Rapoport |
| 7,423,431 B2 | | 9/2008 | Amm |
| 7,529,575 B2 | | 5/2009 | Rezzonico |
| 7,551,954 B2 | | 6/2009 | Green |
| 7,800,368 B2 | | 9/2010 | Vaughan |
| 7,999,541 B2 | | 8/2011 | Chisholm |
| 8,089,281 B2 | | 1/2012 | Zhai |
| 8,319,496 B2 | | 11/2012 | Eryaman |
| 8,405,479 B1 | | 3/2013 | Cleveland |
| 8,471,558 B2 | | 6/2013 | Chisholm |
| 8,674,797 B2 | | 3/2014 | Aoki |
| 8,712,706 B2 | | 4/2014 | Leskowitz |
| 8,896,310 B2 | | 11/2014 | Rapoport |
| 8,969,829 B2 | | 3/2015 | Wollenweber |
| 9,100,111 B2 | | 8/2015 | Behrendt |
| 9,157,975 B2 | | 10/2015 | Dale |
| 9,159,479 B2 | | 10/2015 | Rotem |
| 9,400,318 B2 | | 7/2016 | Fautz |
| 9,696,269 B2 | | 7/2017 | Fordham |
| 9,952,294 B2 | | 4/2018 | Leskowitz |
| 10,222,434 B2 | | 3/2019 | Poole |
| 10,224,135 B2 | | 3/2019 | Rapoport |
| 10,274,561 B2 | | 4/2019 | Poole |
| 10,281,541 B2 | | 5/2019 | Poole |
| 10,330,755 B2 | | 6/2019 | Poole |
| 10,353,030 B2 | | 7/2019 | Poole |
| 10,371,773 B2 | | 8/2019 | Poole |
| 10,444,310 B2 | | 10/2019 | Poole |
| 10,847,294 B2 | | 11/2020 | Rapoport |
| 2001/0013779 A1 | | 8/2001 | Marek |
| 2002/0050895 A1 | | 5/2002 | Zuk |
| 2004/0108253 A1 | | 6/2004 | Broyer |
| 2005/0030028 A1 | | 2/2005 | Clarke |
| 2005/0043612 A1 | | 2/2005 | Saint-Jalmes |
| 2005/0275665 A1 | | 12/2005 | Kejser |
| 2007/0068862 A1 | | 3/2007 | Sisemore |
| 2007/0096737 A1 | | 5/2007 | Rapoport |
| 2007/0108850 A1 | | 5/2007 | Chertok |
| 2007/0249928 A1 | | 10/2007 | Blezek |
| 2007/0265520 A1 | | 11/2007 | Posse |
| 2007/0273378 A1 | | 11/2007 | Trequattrini |
| 2008/0001601 A1 | | 1/2008 | Sellers |
| 2008/0013244 A1 | | 1/2008 | Schultz |
| 2008/0013245 A1 | | 1/2008 | Schultz |
| 2008/0246476 A1 | | 10/2008 | Rapoport |
| 2009/0072939 A1 | | 3/2009 | Shen |
| 2009/0085700 A1 | | 4/2009 | Lian |
| 2009/0120615 A1 | | 5/2009 | Icoz |
| 2009/0259560 A1 | | 10/2009 | Bachenheimer |
| 2011/0090033 A1 | | 4/2011 | Sankar |
| 2012/0119742 A1 | | 5/2012 | Rapoport |
| 2014/0257081 A1 | | 9/2014 | Rapoport |
| 2014/0320247 A1 | | 10/2014 | Fullerton |
| 2014/0320248 A1 | | 10/2014 | Fullerton |
| 2015/0059157 A1 | | 3/2015 | Rapoport |
| 2015/0061680 A1 | | 3/2015 | Leskowitz |
| 2015/0109080 A1 | | 4/2015 | Fullerton |
| 2015/0137812 A1 | | 5/2015 | Rapoport |
| 2015/0168519 A1 | | 6/2015 | Rapoport |
| 2015/0253397 A1 | | 9/2015 | Rapoport |
| 2015/0253400 A1 | | 9/2015 | Rapoport |
| 2015/0253401 A1 | | 9/2015 | Rapoport |
| 2015/0348690 A1 | | 12/2015 | Fullerton |
| 2016/0022123 A1 | | 1/2016 | Katznelson |
| 2016/0032712 A1 | | 2/2016 | Frosell |
| 2019/0013132 A1 | | 1/2019 | Rapoport |
| 2021/0151232 A1 | | 5/2021 | Rapoport |

FOREIGN PATENT DOCUMENTS

| | | |
|---|---|---|
| CN | 105390229 A | 3/2016 |
| EP | 0921527 | 6/1999 |
| EP | 0921537 | 6/1999 |
| EP | 1619667 | 1/2006 |
| EP | 4258000 A3 | 12/2023 |
| GB | 863272 A | 3/1961 |
| GB | 2278231 A | 11/1994 |
| JP | 2001326118 A | 11/2001 |
| JP | 2006003892 | 1/2006 |
| JP | 2007165741 A | 6/2007 |
| JP | 2008545492 A | 12/2008 |
| JP | 2013512442 | 4/2013 |
| JP | 2016522412 A | 7/2016 |
| JP | 2020526243 A | 8/2020 |
| WO | 9728544 | 8/1997 |
| WO | 2005074608 | 8/2005 |

(56) References Cited

FOREIGN PATENT DOCUMENTS

| WO | 2007052275 | 5/2007 |
|---|---|---|
| WO | 2011001429 | 1/2011 |
| WO | 2014141251 | 9/2014 |
| WO | 2014194408 A1 | 12/2014 |

OTHER PUBLICATIONS

European Patent Office Communication Under Rule 71(3) EPC issued in App. No. EP18831754.9, dated Jan. 17, 2023, 32 pages.
Extended European Search Report for App. No. EP18831754.9, dated Jul. 6, 2021, 9 pages.
Extended European Search Report for App. No. EP23193865.5, dated Nov. 27, 2023, 28 pages.
International Preliminary Report on Patentability for Application No. PCT/IL2018/050740, dated Jan. 23, 2020, 6 pages.
Japanese Notice of Allowance (including English translation) issued in App. No. JP2021-072310, dated Mar. 28, 2023, 4 pages.
Japanese Office Action (with English translation) issued in App. No. JP2021-072310, mailing date Jun. 28, 2022, 9 pages.
Japanese Office Action for App. No. JP2019-568312, dated Sep. 18, 2020, 8 pages.
Keith Wachowicz, "Evaluation of Active and Passive Shimming in Magnetic Resonance Imaging", Research and Reports in Nuclear Medicine. 1-12, 2014.
Liming Hong and Donglin Zu, Shimming Permanent Magnet of MRI Scanner, Piers Online, 2007, vol. 3, No. 6, 859-864.
McGinley et al., A permanent MRI magnet for magic angle imaging having its field parallel to the poles, Journal of Magnetic Resonance, 2016, 271; 60-67.
Notice of Allowability dated Oct. 22, 2020 for U.S. Appl. No. 15/645,568 (pp. 1-2).
Notice of Allowance dated Jul. 13, 2020 for U.S. Appl. No. 15/654,568 (pp. 1-7).
Office Action (Non-Final Rejection) dated Feb. 3, 2023 for U.S. Appl. No. 17/103,534 (pp. 1-8).
Office Action (Notice of Allowance and Fees Due (PTOL-85)) dated Aug. 22, 2023 for U.S. Appl. No. 17/103,534 (pp. 1-8).
Office Action (Notice of Allowance and Fees Due (PTOL-85)) dated Dec. 20, 2023 for U.S. Appl. No. 17/103,534 (pp. 1-2).
R Prost and L F Czervionke, How does an MR scanner operate? American Journal of Neuroradiology, Aug. 1994, 15 (7) 1383-1386.
Yingying Yao, Yong-Kwon Choi and Chang-Seop Koh, The Optimal Design of Passive Shimming Elements for High Homogenous Permanent Magnets Utilizing Sensitivity Analysis, Journal of Electrical Engineering & Technology, 2006, vol. 1, No. 4, pp. 461-465.
Z. Ren et al. "Study on Shimming Method for Open Permanent Magnet of MRI", Progress in Electromagnetics Research M, vol. 6, 23-34, 2009.

SYSTEM FOR GENERATING A MAGNETIC FIELD

FIELD OF THE INVENTION

Generally, the present invention relates to magnetic devices. More particularly, the present invention relates to systems for generating a magnetic field.

BACKGROUND OF THE INVENTION

Generally, magnetic resonance based devices can be utilized, for example, to image at least a portion of a patient and/or to perform a magnetic resonance spectroscopy of a sample. Typically, the magnetic resonance based devices can require a generation of a substantially high, stable and/or uniform magnetic field within a measurement volume of the device.

Some of magnetic resonance based devices can include permanent magnets to generate a magnetic field. One difficulty in generating a magnetic field in a measurement volume using permanent magnet(s) that is sufficient (e.g., that is substantially stable and/or uniform) for magnetic resonance spectroscopy and/or magnetic imaging is that magnetic fields produced by the permanent magnets(s) can be non-homogeneous, thus typically resulting in a non-homogenous magnetic field within the measurement volume.

Some current solutions for creating a homogenous and/or stable magnetic field within a measurement volume using a permanent magnet can include, for example, adding additional elements to a magnetic resonance based device (e.g., coils) and/or increasing the size of the permanent magnets. One difficulty with current solutions is that as, for example, the number of elements in the magnetic resonance based device increases and/or the size, shape and/or weight of the permanent magnets in the magnetic resonance based device increases, the weight and/or size of the whole device can increase, thereby increasing, for example, a manufacturing, shipment and/or installation cost.

In another example, for magnetic resonance based devices in an industrial setting (e.g., nuclear magnetic measurement (NMR) devices that measure properties of fluids and/or drilling muds in oil production facilities), a heavy and/or large device can prevent personnel from measuring the fluids/muds at various locations in the processes.

SUMMARY OF THE INVENTION

There is thus provided, in accordance with some embodiments of the invention, a magnet for generating a magnetic field having a desired magnetic field strength and a desired magnetic field direction, the magnet including: a plurality of magnetic segments, each magnetic segment positioned adjacent to at least one of the plurality of magnetic segments, and each magnetic segment having a magnetization direction, wherein the magnetization direction is based on the desired magnetic field strength and the desired magnetic field direction.

In some embodiments, the magnetization direction of each magnetic segment is further based on the magnetization direction of respective adjacent magnetic segments.

In some embodiments, each of the plurality of magnetic segments has an identical shape.

In some embodiments, each of the plurality of magnetic segments has an identical magnetization direction.

In some embodiments, the desired magnetic field strength and the desired magnetic field direction is based on an application of the magnet.

In some embodiments, each of the plurality of magnetic segments is a permanent magnet.

In some embodiments, each of the plurality of magnetic segments has identical size.

In some embodiments, each of the plurality of magnetic segments has a shape selected from a group consisting of: a cube, a hyper-rectangle, a parallelepiped, a sphere and a cylinder.

There is thus provided, in accordance with some embodiments of the invention, a ferromagnetic element for generating a magnetic field having a desired magnetic field direction, the ferromagnetic element including: a plurality of ferromagnetic segments, each ferromagnetic segment positioned adjacent to at least one of the plurality of ferromagnetic segments, wherein the plurality of ferromagnetic form a ferromagnetic element with a desired magnetic field direction.

In some embodiments, each of the plurality of ferromagnetic segments has identical size.

In some embodiments, each of the plurality of ferromagnetic segments has identical shape.

There is thus provided, in accordance with some embodiments of the invention, a system for generating a magnetic field having a desired magnetic field strength and a desired magnetic field direction, the system including: a plurality of magnetic segments, each magnetic segment positioned adjacent to at least one of the plurality of magnetic segments, and each magnetic segment having a magnetization direction; and a plurality of ferromagnetic segments, each ferromagnetic segment positioned adjacent to at least one of the plurality of magnetic segments; wherein the magnetization direction is based on the desired magnetic field strength and the desired magnetic field direction.

In some embodiments, the magnetization direction of each magnetic segment is further based on the magnetization direction of respective adjacent magnetic segments.

In some embodiments, the system further includes a plurality of fluid filled segments wherein each of the plurality of fluid filled segment is positioned adjacent to at least one of the plurality of magnetic segments, and wherein at least one of the fluid filled segments comprises air.

In some embodiments, shape and size of at least one fluid filled segment corresponds to the shape and size of at least one of magnetic segments and ferromagnetic segments.

In some embodiments, at least one of the magnetic segments and the ferromagnetic segments has a shape selected from a group consisting of: a cube, a hyper-rectangle, a parallelepiped, and a cylinder.

In some embodiments, the magnetization direction of at least one magnetic segment is along an axis passing between two parallel faces of that magnetic segment.

In some embodiments, the magnetization direction of at least one magnetic segment is along an axis passing between two opposite corners of that magnetic segment.

In some embodiments, the magnetization direction of at least one magnetic segment is along an axis passing between two opposite edges of that segment.

In some embodiments, the shape of at least one magnetic segment corresponds to the shape of at least one ferromagnetic segment.

In some embodiments, size of at least one magnetic segment corresponds to the size of at least one ferromagnetic segment.

In some embodiments, the magnetization direction of at least one magnetic segment corresponds to a positioning of that segment within the system.

In some embodiments, a change in positioning of at least one magnetic segment corresponds to a change in the generated magnetic field.

In some embodiments, a change in magnetization direction of at least one magnetic segment corresponds to a change in the generated magnetic field.

In some embodiments, the system further includes a predefined mesh configured to arrange each of the plurality of segments into a desired position.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, can be understood by reference to the following detailed description when read with the accompanying drawings in which:

It will be appreciated that, for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention can be practiced without these specific details. In other instances, well-known methods, procedures, and components have not been described in detail so as not to obscure the present invention.

Figure 1A:
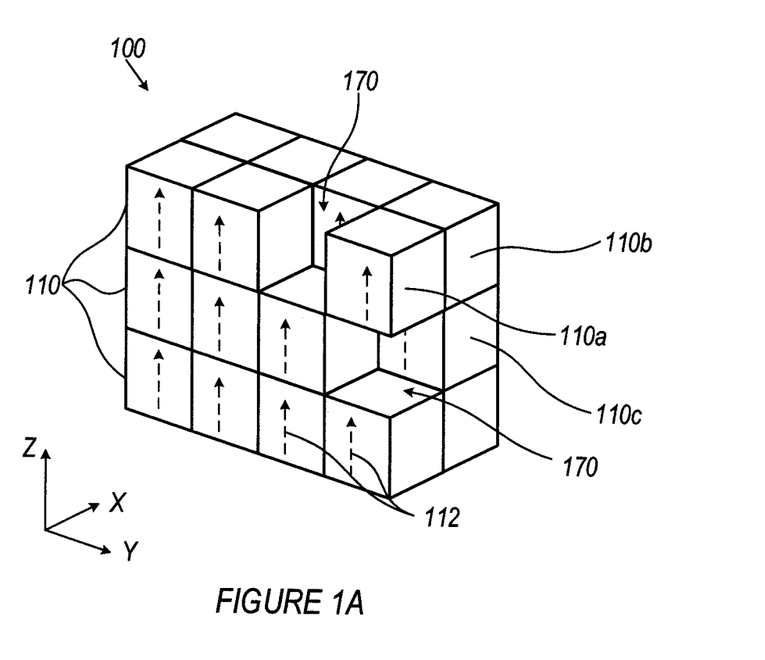
FIG. 1A schematically illustrates a magnet for generating a magnetic field, according to some embodiments of the invention.

Reference is now made to FIG. 1A, which schematically illustrates a first magnet 100 for generating a magnetic field, according to some embodiments of the invention.

The magnet 100 (e.g., first magnet) can include a plurality of magnetic segments 110 (e.g., first magnetic segments). Each first magnetic segment 110 can be positioned adjacent to another first magnetic segment 110 of the plurality of first magnetic segments 110. Each first magnetic segment 110 can have a magnetization direction 112 (e.g., indicated by a dashed arrow in FIG. 1A). In some embodiments, first magnetic segments 110 are permanent magnets.

The first magnet 100 can include a configuration of the first magnetic segments 110 (e.g., placement, number of magnetic segments, and/or orientation) to generate a magnetic field having a desired magnetic field strength and/or a desired magnetic field direction. In various embodiments, the desired strength and/or direction of the magnetic field generated by the first magnet 100 is predetermined based on the application of the magnet. For example, the first magnet 100 can be used in a device capable of imaging at least a portion of a patient (e.g., the magnetic field strength in a 1 Tesla range) and/or in a device capable of performing a magnetic resonance spectroscopy of a sample (e.g., the magnetic field strength in a 0.1-2 Tesla range).

The magnetization direction 112 of each of the first magnetic segments 110 can be predetermined based on the desired strength and/or direction of the magnetic field generated by the first magnet 100. In some embodiments, each of the first magnetic segments 110 in the first magnet 100 has identical magnetization direction 112, for example as shown in FIG. 1A. In some embodiments, the magnetization direction 112 of at least one first magnetic segment 110 is different compared to other first magnetic segments 110. In some embodiments, the magnetization direction 112 of each of the first magnetic segments 110 in the first magnet 100 is predetermined based on the magnetization direction 112 of respective adjacent first magnetic segments 110. For example, the magnetization direction 112 of first magnetic segment 110a can be predetermined based on magnetization direction 112 of adjacent first magnetic segment 110b and/or on magnetization direction 112 of adjacent first magnetic segment 110c (e.g., as shown in FIG. 1A).

In various embodiments, each of the first magnetic segments 110 in the first magnet 100 has an identical shape (e.g., a cube as shown in FIG. 1A) and/or at least a portion of the first magnetic segments 110 have different shapes. The shape of the first magnetic segments 110 can include, for example, a cube, a hyper-rectangle, a parallelepiped, a sphere and/or a cylinder. In various embodiments, each of the first magnetic segments 110 in the first magnet 100 has an identical size and/or shape (e.g., as shown in FIG. 1A) and/or at least a portion of the first magnetic segments 110 have different sizes and/or shapes. For example, each of the first magnetic segments 110 can have a cube shape and/or can have an edge length ranging between 7-900 mm.

In various embodiments, the first magnet 100 can include at least one fluid filled segment 170. The fluid filled segments 170 can be positioned adjacent to the first magnetic segments 110, for example as shown in FIG. 1A. In some embodiments, the fluid filled segments 170 include air as an air gap between other first magnetic segments 110. In various embodiments, shape and/or size of at least one fluid filled segment 170 corresponds to the shape and/or size of at least one first magnetic segment 110. In some embodiments, the structure of at least one fluid filled segment 170 has a frame to support at least one adjacent first magnetic segment 110.

Figure 1B:
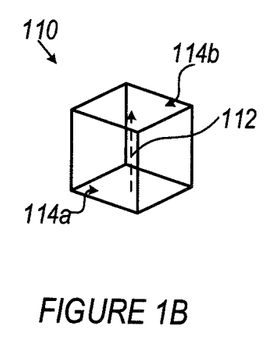
FIGS. 1B-1D schematically illustrate various magnetization directions of a first magnetic segment, according to some embodiments of the invention.
Figure 1C:
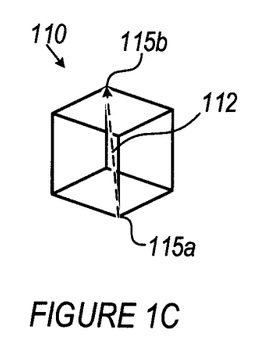
Figure 1D:
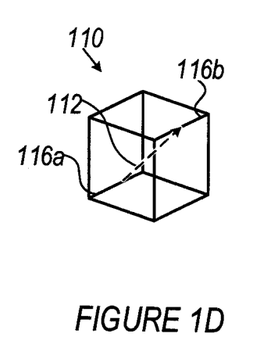

Reference is now made to FIGS. 1B-1D, which schematically illustrate various magnetization directions 112 of a first magnetic segment 110, according to some embodiments of the invention.

The magnetization direction 112 of the first magnetic segment 110 can be aligned along an axis passing between parallel faces of the segment, for example faces 114a, 114b as shown in FIG. 1B. The magnetization direction 112 of the first magnetic segment 110 can be aligned along an axis passing between opposite corners of the segment, for example corners 115a, 115b as shown in FIG. 1C. The magnetization direction 112 of the first magnetic segment 110 can be aligned along an axis passing between opposite edges of the segment, for example edges 116a, 116b as shown in FIG. 1D.

Figure 2:
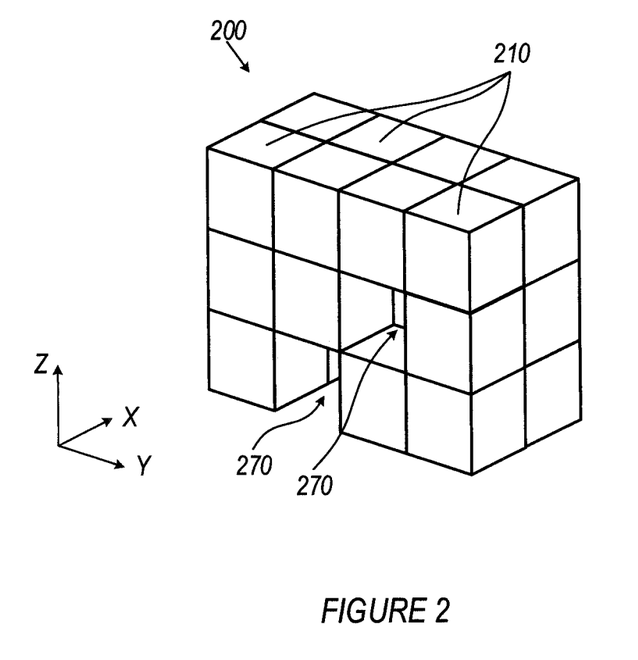
FIG. 2 schematically illustrates a ferromagnetic element, according to some embodiments of the invention.

Reference is now made to FIG. 2, which schematically illustrates a ferromagnetic element 200, according to some embodiments of the invention.

The ferromagnetic element 200 (e.g., first ferromagnetic element), for example a pole piece for an MRI device, can include a plurality of ferromagnetic segments 210 (e.g., first ferromagnetic segments). Each of the first ferromagnetic segments 210 can be positioned adjacent to the at least one other first ferromagnetic segment 210.

In various embodiments, each of the first ferromagnetic segments 210 in the first ferromagnetic element 200 has an identical shape (e.g., a cube as shown in FIG. 2) and/or at least a portion of the first ferromagnetic segments 210 have different shapes. In various embodiments, each of the first ferromagnetic segments 210 in first ferromagnetic element 200 has an identical size (e.g., as shown in FIG. 2) and/or at least a portion of the first ferromagnetic segments 210 have different sizes. In some embodiments, the first ferromagnetic segments 210 form the first ferromagnetic element 200 with a desired magnetic field direction.

The first ferromagnetic element 200 can include at least one fluid filled segment 270. The fluid filled segment 270 can be positioned adjacent to and/or between the ferromagnetic segments 210, for example as shown in FIG. 2. In some embodiments, the fluid filled segments 270 include air as an air gap between other ferromagnetic segments 210. In various embodiments, shape and/or size of at least one fluid filled segment 270 corresponds to the shape and/or size of least one ferromagnetic segment 210. In some embodiments, the structure of at least one fluid filled segment 270 has a frame to support at least one adjacent first ferromagnetic segment 210.

Figure 3:
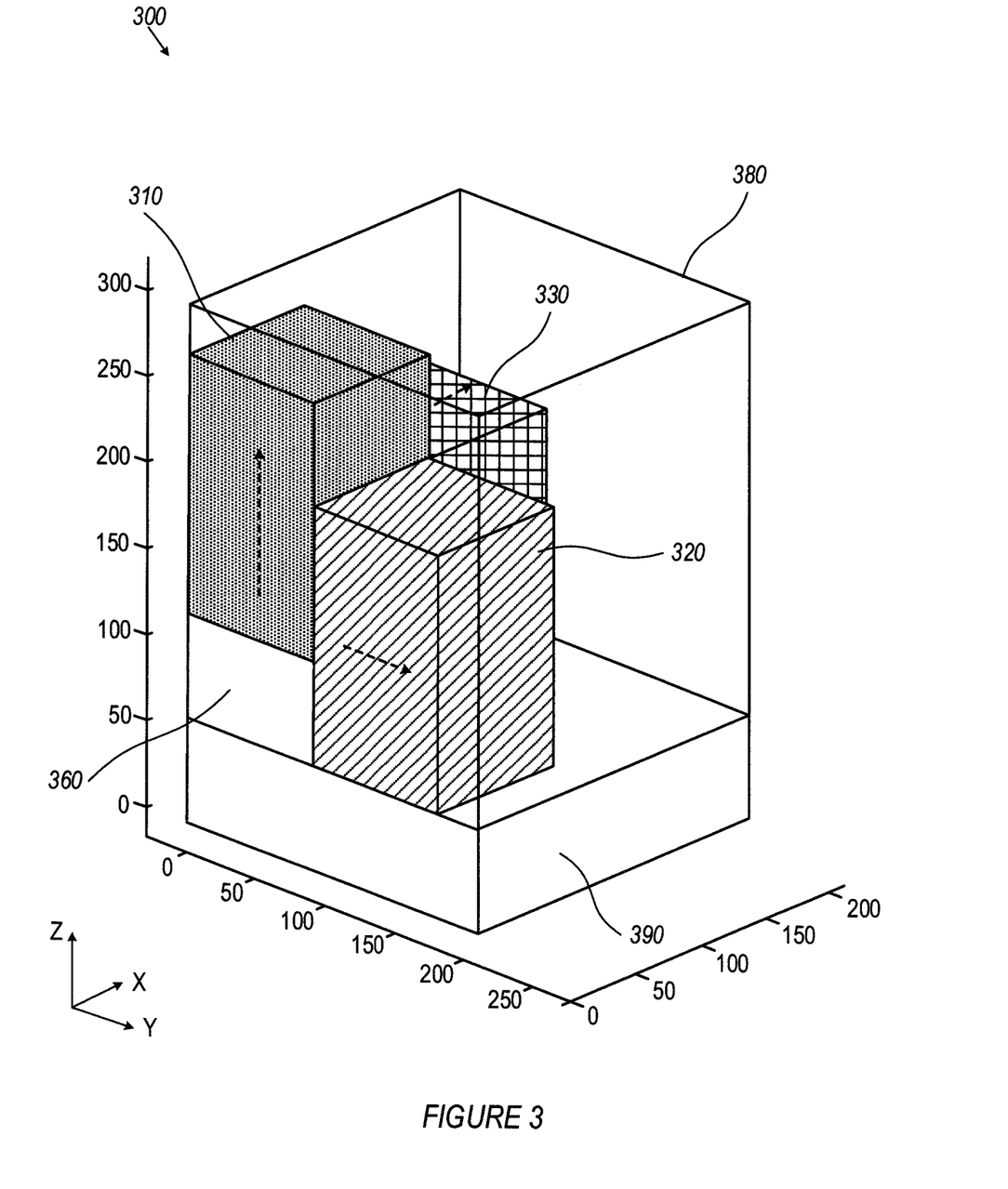
FIGS. 3-5 schematically illustrate various configurations of a system for generating a magnetic field, including different number of magnetic blocks and/or segments, according to some embodiments of the invention.
Figure 4:
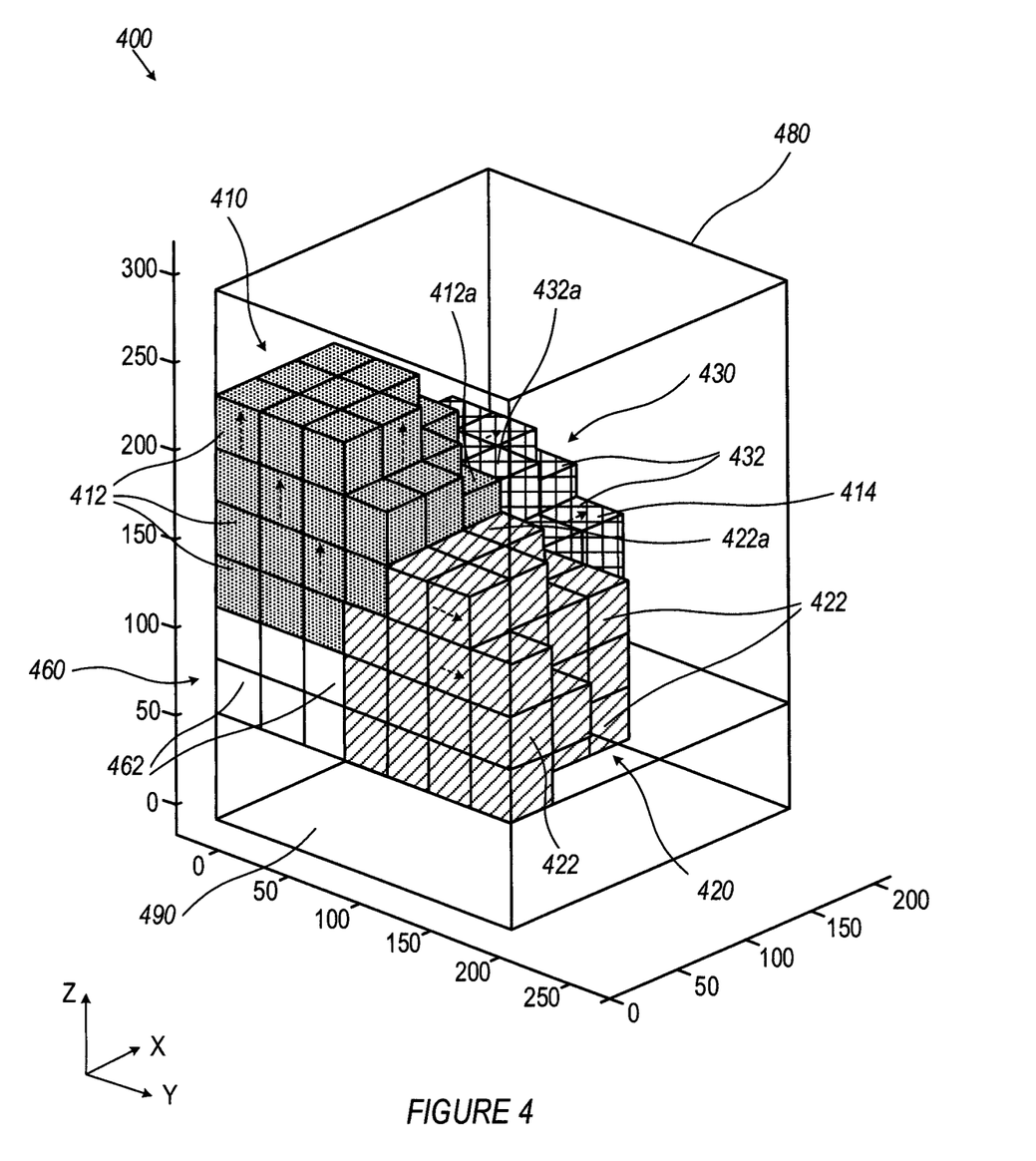
Figure 5:
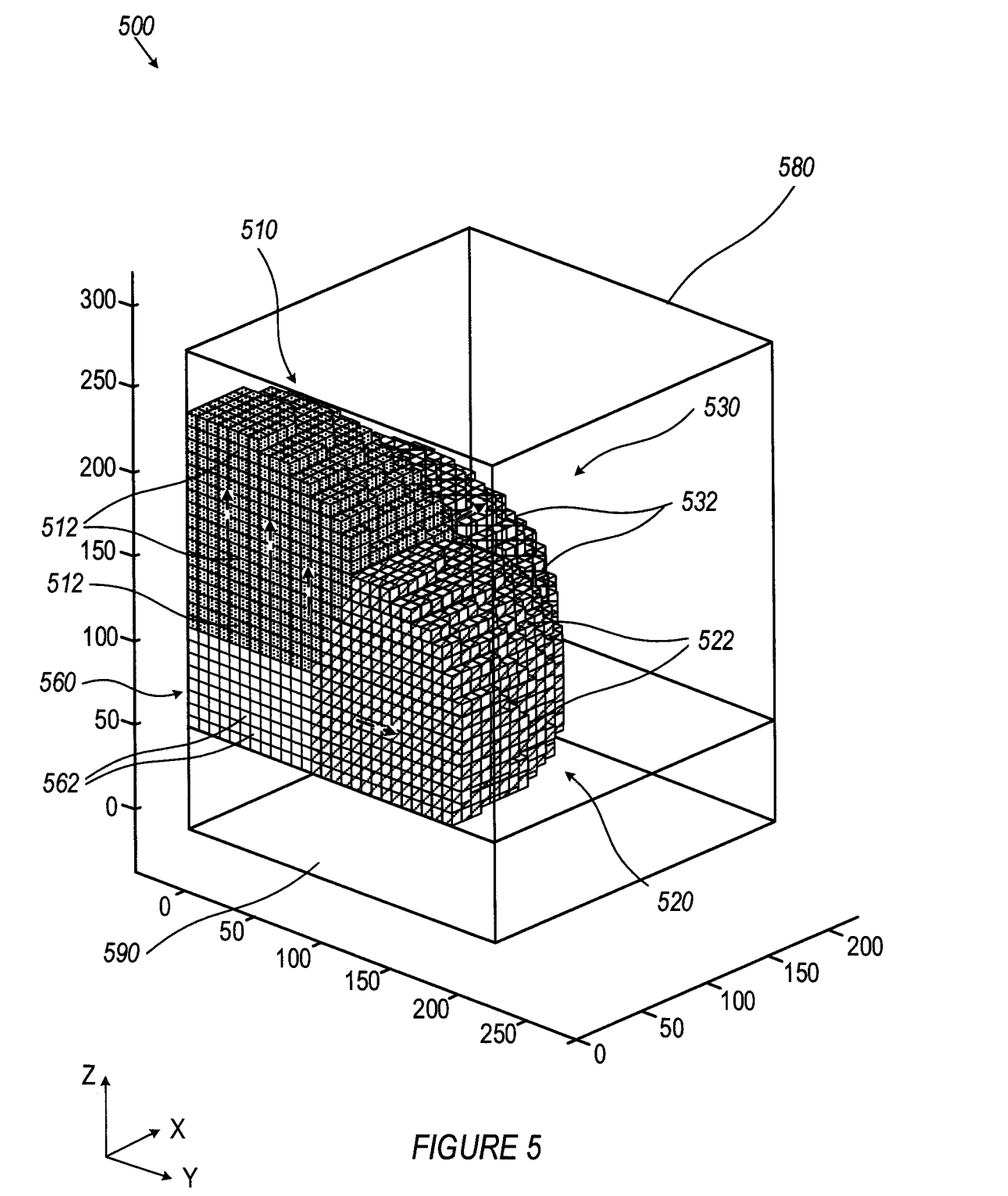

Reference is now made to FIGS. 3-5, which schematically illustrate various configurations of a system for generating a magnetic field, including different number of magnetic blocks and/or segments, according to some embodiments of the invention.

FIG. 3 illustrates a system 300 for generating a magnetic field that can include, for example, one first magnetic block 310, one second magnetic block 320 and/or one third magnetic block 330. It is appreciated that FIG. 3 schematically illustrates a portion (e.g., one-eighth) of the entire system 300. In some embodiments, at least one of the first magnetic block 310, second magnetic block 320 and/or third magnetic block 330 is a permanent magnet. Each of the first magnetic block 310, second magnetic block 320 and/or third magnetic block 330 can be positioned adjacent to at least one of the other magnetic blocks. For example, the first magnetic block 310 can be positioned adjacent to the second and/or third magnetic blocks 320, 330, respectively (e.g., as shown in FIG. 3). The first magnetic block 310, second magnetic block 320 and/or third magnetic block 330 can generate a magnetic field with a desired strength and/or direction within the system 300. In various embodiments, each of the first magnetic block 310, second magnetic block 320 and/or third magnetic block 330 has a shape selected from a group consisting of: a cube, a hyper-rectangle, a parallelepiped, and/or a cylinder. For example, each of the first magnetic block 310, second magnetic block 320 and/or third magnetic block 330 can have a hyper-rectangle shape and/or a length of 180 mm and/or a width of 90 mm (e.g., as shown in FIG. 3).

The system 300 can include at least one ferromagnetic block 360 that can be positioned adjacent to at least one of the first magnetic block 310, second magnetic block 320 and/or third magnetic block 330.

Each of the first magnetic block 310, second magnetic block 320, and/or third magnetic block 330 can have a predetermined magnetization direction. For example, the magnetization direction of the first magnetic block 310 can be aligned along the Z axis, the magnetization direction of the second magnetic block 320 can be aligned along the X axis and/or the magnetization direction of the third magnetic block 330 can be aligned along the ¥ axis (e.g., as indicated by a dashed arrow in FIG. 3). As may be apparent to one of ordinary skill in the art, while FIG. 3 illustrates the magnetization directions of the first magnetic block 310, second magnetic block 320 and third magnetic block 330 being parallel to Z, X, Y axes, respectively, each of the first magnetic block 310, second magnetic block 320 and third magnetic block 330 can have a magnetization in various directions.

The system 300 can include a shell 380. The shell 380 can at least partly surround the first magnetic block 310, second magnetic block 320, third magnetic block 330 and/or the at least one ferromagnetic block 360. The shell 380 can include a metal alloy and/or can substantially reduce a magnetic fringe filed outside the shell. In various embodiments, the first magnetic block 310, second magnetic block 320, third magnetic block 330 and/or the ferromagnetic block 360 are arranged within the shell 380 to form a measurement volume 390. The shell 380 can also include an opening (not shown) to provide an access to the measurement volume 390. In some embodiments, the measurement volume 390 includes air.

FIG. 4 illustrates a system 400 for generating a magnetic field that can include a plurality of magnetic segments, for example, second magnetic segments 412, third magnetic segments 422 and/or fourth magnetic segments 432. It is appreciated that FIG. 4 schematically illustrates a portion (e.g., one-eighth) of the entire system 400. In some embodiments, at least a portion of the second magnetic segments 412, third magnetic segments 422, and fourth magnetic segments 432 are permanent magnets. The second magnetic segments 412, third magnetic segments 422 and/or fourth magnetic segments 432 can generate a magnetic field with a desired strength and/or direction within the system 400. In various embodiments, the second magnetic segments 412 form a second magnet 410, the third magnetic segments 422 form a third magnet 420 and/or the fourth magnetic segments 432 form a fourth magnet 430. At least one of the second magnet 410, the third magnet 420, and/or the fourth magnet 430 can be identical to the first magnet 100. At least one of the second magnetic segments 412, third magnetic segments 422, and/or fourth magnetic segments 432 can be identical to the first magnetic segments 110 as described above with respect to FIG. 1A.

Each of the second magnetic segments 412, third magnetic segments 422, and/or fourth magnetic segments 432 can be positioned adjacent to the at least one of the plurality of the magnetic segments. For example, each of the second magnetic segments 412 can be positioned adjacent to at least one second magnetic segment 412 and/or at least one second magnetic segments 412 can be positioned adjacent to the third magnetic segments 422 (e.g., as shown in FIG. 4).

The system 400 can include a plurality of second ferromagnetic segments 462. Each second ferromagnetic segment 462 can be positioned adjacent to at least one of the plurality of the second ferromagnetic segments 462 and/or adjacent to the at least one of the second magnetic segments 412, third magnetic segments 422, and/or fourth magnetic segments 432. The second ferromagnetic segments 462 can form at least one second ferromagnetic element 460 with a desired magnetic field and/or a desired strength direction. The at least one second ferromagnetic element 460 can be identical to the first ferromagnetic element 200 and/or each of the second ferromagnetic segments 462 can be identical to at least one first ferromagnetic segment 210, as described above with respect to FIG. 2. The at least one second ferromagnetic element 460 can be positioned adjacent to at least one of the second magnets 410, third magnet 420 and/or fourth magnet 430 of the system 400.

The system 400 can include a plurality of fluid filled segments 470. The fluid filled segments 470 can be positioned adjacent to at least one second magnetic segment 412, third magnetic segment 422, and/or fourth magnetic segment 432 (e.g., as shown in FIG. 4) and/or adjacent to at least one of the second ferromagnetic segments 462. In some embodiments, the fluid filled segments 470 include air. In some embodiments, the structure of at least one fluid filled segment 470 has a frame to support at least one of adjacent second magnetics segment 412, third magnetic segments 422, fourth magnetic segments 432 and/or second ferromagnetic segment 462.

In various embodiments, the shape and/or size of at least one fluid filled segment 470 corresponds to the shape and/or size of at least one second magnetic segment 412, third magnetic segment 422, fourth magnetic segment 332 and/or second ferromagnetic segment 362. In various embodiments, at least one second magnetic segments 312, third magnetic segment 322, fourth magnetic segment 432 and/or second ferromagnetic segment 462 has a shape selected from a group consisting of: a cube, a hyper-rectangle, a parallelepiped, and/or a cylinder. In various embodiments, the shape and/or the size of at least one second magnetic segment 412, third magnetic segment 422, and/or fourth magnetic segment 432 corresponds to the shape and/or the size of at least one second ferromagnetic segment 462. For example, each of the second magnetic segments 412, third magnetic segments 422, third magnetic segments 432 and/or second ferromagnetic segments 462 can have a cubic shape and/or an edge length of 30 mm (e.g., as shown in FIG. 4). The system 400 can include a shell 480. The shell 480 can at least partly surround the second magnetic segments 412, third magnetic segment 422, fourth magnetic segment 432, second ferromagnetic segments 462 and/or fluid filled segments 470. In some embodiments, the shell 480 is identical to the shell 380 as described above with respect to FIG. 3. The shell 480 can include a metal alloy and/or can substantially reduce a magnetic fringe filed outside the shell. In various embodiments, the second magnetic segments 412, third magnetic segment 422, fourth magnetic segment 332 the ferromagnetic segments 462 and/or the fluid filled segments 470 are arranged within the shell 480 to form a measurement volume 490. The shell 480 can also include an opening (not shown) to provide an access to the measurement volume 490. In some embodiments, the measurement volume 490 includes air. In some embodiments, the measurement volume 490 is identical to the measurement volume 390 as described above with respect to FIG. 3.

Each of the second magnetic segments 412, third magnetic segments 422, and/or fourth magnetic segments 432 can have a predetermined magnetization direction. For example, the magnetization direction of the second magnetic segments 412 can be aligned along the Z axis, the magnetization direction of the third magnetic segments 422 can be aligned along the X axis and/or the magnetization direction of the fourth magnetic segments 432 can be aligned along the ¥ axis (e.g., as indicated by a dashed arrow in FIG. 4).

As may be apparent to one of ordinary skill in the art, while FIG. 4 illustrates the magnetization directions of the second magnetic segments 412, third magnetic segments 422, and fourth magnetic segments 432 being parallel to Z, X, ¥ axes, respectively, each of the second magnetic segments 412, third magnetic segments 422, and fourth magnetic segments 432 can have a magnetization in various directions. For example, the magnetization direction of at least a portion of the second magnetic segments 412, third magnetic segments 422, and/or fourth magnetic segments 432 can be along an axis passing between two parallel faces of that magnetic segment (e.g., as shown in FIGS. 1A, 1B, and 3), along an axis passing between two opposite corners of that magnetic segment (e.g., as shown in FIG. 1C) and/or along an axis passing between two opposite edges of that magnetic segment (e.g., as shown in FIG. 1D).

In various embodiments, the magnetization direction of each of the second magnetic segments 412, third magnetic segments 422, and/or fourth magnetic segments 432 can be based on the desired strength and/or direction of the magnetic field generated by the system 400. The magnetization direction of each of the second magnetic segments 412, third magnetic segments 422, and/or fourth magnetic segments 432 can also be based on the magnetization direction of respective adjacent magnetic segments. For example, the magnetization direction of second magnetic segment 412a can be based on the magnetization direction of adjacent second magnetic segments 412 and/or based on the magnetization direction of adjacent third and/or fourth magnetic segments 422a, 432a, respectively (e.g., as shown in FIG. 4).

The magnetization direction of each of the second magnetic segments 412, third magnetic segments 422, and/or fourth magnetic segments 432 can correspond to a positioning of that segment within the system 400. For example, a position of second magnetic segment 412a in the system 400 can be predetermined and/or the magnetization direction of the second magnetic segment 412a can be thereby predetermined based on the predetermined position of the second magnetic segment 412a.

In various embodiments, a change in positioning and/or in the magnetization direction of the at least one of the second magnetic segments 412, third magnetic segments 422, and/or fourth magnetic segments 432 can correspond to a change in the magnetic field generated by the system 400. For example, a change in the predetermined position and/or the predetermined magnetization direction of the second magnetic segment 412a can change the direction and/or the strength of the magnetic field generated by the system 400.

The system 400 can include a predefined mesh. The mesh can be configured to arrange each of the second magnetic segments 412, third magnetic segments 422, fourth magnetic segments 432 and/or second ferromagnetic segments 462 into a predetermined position. The mesh can be made of a non-magnetic and/or a non-paramagnetic material, for example, titanium.

FIG. 5 illustrates a system 500 for generating a magnetic field that can include a plurality of magnetic segments, for example fifth magnetic segments 512, sixth magnetic segments 522 and/or seventh magnetic segments 532. It is appreciated that FIG. 5 schematically illustrates a portion (e.g., one-eighth) of the entire system 500. In some embodiments, at least a portion of fifth magnetic segments 512, sixth magnetic segments 522, and seventh magnetic segments 532 are permanent magnets. The fifth magnetic segments 512, sixth magnetic segments 522 and/or seventh magnetic segments 532 can generate a magnetic field with a desired strength and/or direction within the system 500.

In various embodiments, the fifth magnetic segments 512 form a fifth magnet 510, the sixth magnetic segments 522 form a sixth magnet 520 and/or the seventh magnetic segments 532 form a seventh magnet 530. At least one of the fifth magnet 510, sixth magnet 520, and/or seventh magnet 430 can be identical to the first magnet 100 (e.g., as described above with respect to FIG. 1A), second magnet 410, third magnet 420 and/or fourth magnet 440 (e.g., as described above with respect to FIG. 4). At least one of the fifth magnetic segments 512, sixth magnetic segments 522 and/or seventh magnetic segments 532 can be identical to the first magnetic segments 110 (e.g., as described above with respect to FIG. 1A), second magnetic segments 412, third magnetic segments 422 and/or fourth magnetic segments 432 (e.g., as described above with respect to FIG. 4). Each of the fifth magnetic segments 512, sixth magnetic segments 522 and/or seventh magnetic segments 532 can be positioned adjacent to the at least one of the plurality of the magnetic segments (e.g., as described above with respect to FIG. 4).

The system 500 can include a plurality of third ferromagnetic segments 562 that can form at least one third ferromagnetic element 560 with a desired magnetic field and/or a desired strength direction. The at least one second ferromagnetic element 560 can be identical to the first ferromagnetic element 200 (e.g., as described above with respect to FIG. 2) and/or second ferromagnetic element 460 (e.g., as described above with respect to FIG. 4). Each of the third ferromagnetic segments 562 can be identical to at least one first ferromagnetic segment 210 (e.g., as described above with respect to FIG. 2) and/or the second ferromagnetic segments 462 (e.g., as described above with respect to FIG. 4). The at least one third ferromagnetic element 560 can be positioned adjacent at least one of the fifth magnets 510, sixth magnet 520, and/or seventh magnet 530 of the system 500 (e.g., as described above with respect to FIG. 4).

The system 500 can include a plurality of fluid filled segments 570 that can include air. The fluid filled segments 570 can be positioned adjacent to at least one fifth magnetic segment 512, sixth magnetic segment 522, and/or seventh magnetic segment 532 and/or adjacent to at least one of the third ferromagnetic segments 562 (e.g., as shown in FIG. 5).

The system 500 can include a shell 580 and/or a measurement volume 590. In various embodiments, the shell 580 is identical to the shell 380, as described above with respect to FIG. 3, and/or to the shell 480, as described above with respect to FIG. 4. In various embodiments, the measurement volume 590 is identical to the measurement volume 390, as described above with respect to FIG. 3, and/or to the measurement volume 490, as described above with respect to FIG. 4.

In various embodiments, each of the fifth magnetic segments 512, sixth magnetic segments 522, seventh magnetic segments 532 and/or third ferromagnetic segments 562 has a shape selected from a group consisting of: a cube, a hyper-rectangle, a parallelepiped, and a cylinder. For example, each of the fifth magnetic segments 512, sixth magnetic segments 522, seventh magnetic segments 532 and/or third ferromagnetic segments 562 can have a cubic shape and/or the edge length of 7.5 mm (e.g., as shown in FIG. 5).

In various embodiments, the position, shape and/or a size of each of the fifth magnetic segments 512, sixth magnetic segments 522, seventh magnetic segments 532, third ferromagnetic segments 562 and/or fluid filled segments 570 is predetermined based on, for example, the strength and/or direction of the magnetic field generated by the system 500 (e.g., as described above with respect to FIG. 4).

In various embodiments, a magnetization direction of each of the fifth magnetic segments 512, sixth magnetic segments 522 and/or seventh magnetic segments 532 is predetermined based on, for example, a strength and/or direction of a magnetic field generated by the system 500 (e.g., as described above with respect to FIG. 4). For example, the magnetization direction of the fifth magnetic segments 512 can be aligned along the Z axis, the magnetization direction of the sixth magnetic segments 522 can be aligned along the X axis and/or the magnetization direction of the fourth magnetic segments 532 can be aligned along the Y axis (e.g., as shown in FIG. 5).

Reference is now made back to FIGS. 3-5. In embodiments, a size, shape, positioning and/or number of magnetic segments and/or blocks, ferromagnetic segments and/or blocks and/or fluid filled segments in a system for generating a magnetic field, as well as a magnetization direction of the magnetic segments and/or blocks is predetermined based on, for example, predetermined parameters of the system and/or based on a desired application of the system. The desired application of the system can include, for example, performing a magnetic resonance imaging of at least a portion of a patient and/or performing a magnetic resonance spectroscopy of a sample. The predetermined requirements of the system can include, for example, a desired magnetic field strength, direction and/or uniformity of the magnetic field, a desired elimination of a magnetic fringe field and/or total weight of the system.

In various embodiments, some magnetic segments and/or blocks can have, for example, more uniform magnetic field as compared to other magnetic segments and/or blocks. In various embodiments, some magnetic segments and/or blocks can have smaller dimensions compared to other magnetic segments and/or blocks. Accordingly, assembling a system for generating a magnetic field using a plurality of small magnetic segments and/or blocks can, for example, increase a strength of the generated magnetic field, improve a shimming to increase a uniformity of the generated magnetic field and/or substantially reduce a generated magnetic fringe field while, for example, reducing a total mass of the magnetic material being used, as compared to a system being assembled using, for example, a smaller number of magnetic segments and/or blocks having larger dimensions.

For example, system 400 that can include a plurality of cubic second magnetic segments 412, third magnetic segments 422 and/or fourth magnetic segments 432 having the edge length of 30 mm (e.g., as shown in FIG. 4) can generate a magnetic field (e.g., the magnetic field that is measured at a center of the measurement volume) that is stronger by 6.2% as compared to a magnetic field generated by the system 300 that can include the hyper-rectangular first magnetic blocks 310, second magnetic blocks 320 and/or third magnetic blocks 330 having the length of 180 mm and width of 90 mm (e.g., as shown in FIG. 3). Similarly, reducing the edge length of the cubic magnetic segments (e.g., the cubic second magnetic segments 412, third magnetic segments 422 and/or fourth magnetic segments 432) to, for example, 15 mm (not shown) and 7.5 mm (e.g., as in the system 500 as shown in FIG. 5) can increase the strength of the generated magnetic field by 7.1% and 7.4%, respectively, as compared to the system 300.

In another example, a uniformity of magnetic field (e.g., determined by $\{max(B)-min(B)\}/Bo$, where B is the magnetic field in a field of view in a radius of 30 mm with respect to the center of the measurement volume and Bo is the magnetic field in the center of the measurement volume thereof) generated by the system 400 that can include a plurality of cubic second magnetic segments 412, third magnetic segments 422 and/or fourth magnetic segments 432 having the edge length of 30 mm (e.g., as shown in FIG. 4) can be improved by 14% as compared to a uniformity of magnetic field generated by the system 300 that can include hyper-rectangular first hyper-rectangular magnetic block 310, second magnetic block 320 and/or third magnetic block 330 having the length of 180 mm and width of 90 mm (e.g., as shown in FIG. 3). Similarly, reducing the edge length of the cubic magnetic segments (e.g., the cubic second magnetic segments 412, third magnetic segments 422 and/or fourth magnetic segments 432) to, for example, 15 mm (not shown), may improve the uniformity of magnetic field by 24% as compared to the system 300.

In another example, a magnetic fringe field generated by the system 400 (e.g., the magnetic field measured at a predetermined distance of 250 mm from the center of the measurement volume) that can include a plurality of cubic second magnetic segments 412, third magnetic segments 422 and/or fourth magnetic segments 432 having the edge length of 30 mm (e.g., as shown in FIG. 4) can be smaller by 36.2% as compared to a magnetic fringe field generated by the system 300 that can include hyper-rectangular first hyper-rectangular magnetic block 310, second magnetic block 320 and/or third magnetic block 330 having the length of 180 mm and width of 90 mm (e.g., as shown in FIG. 3). Assembling a system for generating a magnetic field using a plurality of magnetic segments (e.g., system 400, 500 as shown in FIGS. 4, 5, respectively) can allow forming magnets (e.g., second magnet 410, third magnet 420 and/or fourth magnet 430 as shown in FIG. 4) that can include various shapes, which are not limited to, for example, a cube, a hyper-rectangle, a parallelepiped, and a cylinder. In embodiments, magnetic segments, ferromagnetic segments and/or the fluid filled segments in a system for generating a magnetic field (e.g., the systems 300, 400, 500 as shown in FIGS. 3, 4, 5, respectively) can be scaled in size to generate the magnetic field having a desired strength and/or to provide desired dimensions of a measurement volume (e.g., the measurement volume 390, 490, 590 as shown in FIGS. 3, 4, 5, respectively) based on, for example, a desired application of the system (e.g., performing a magnetic resonance imaging of at least a portion of a patient and/or performing a magnetic resonance spectroscopy of a sample).

Unless explicitly stated, the method embodiments described herein are not constrained to a particular order in time or chronological sequence. Additionally, some of the described method elements can be skipped, or they can be repeated, during a sequence of operations of a method.

Various embodiments have been presented. Each of these embodiments can of course include features from other embodiments presented, and embodiments not specifically described can include various features described herein.

The invention claimed is:

1. A system for generating a magnetic field having a desired magnetic field strength and a desired magnetic field direction, the system comprising:
a first magnet having a first magnetization direction, the first magnet comprising a plurality of first magnetic segments, wherein:
  each of the plurality of first magnetic segments is positioned adjacent to at least two first magnetic segments of the plurality of first magnetic segments,
  each of the plurality of first magnetic segments has a magnetization direction, and
  the magnetization direction of at least one magnetic segment of the plurality of first magnetic segments is different than the magnetization direction of at least one other magnetic segment of the plurality of first magnetic segments; and
a second magnet having a second magnetization direction, the second magnet being adjacent to the first magnet, and the second magnet comprising a plurality of second magnetic segments, wherein:
  each of the plurality of second magnetic segments is positioned adjacent to another second magnetic segment of the plurality of second magnetic segments,
  each of the plurality of second magnetic segments has a magnetization direction, and
  the magnetization direction of at least one magnetic segment of the plurality of second magnetic segments is different than the magnetization direction of at least one other magnetic segment of the plurality of second magnetic segments.

2. The system of claim 1, wherein each of the plurality of second magnetic segments is positioned adjacent to at least two second magnetic segments of the plurality of second magnetic segments.

3. The system of claim 1, further comprising a ferromagnetic element adjacent to the first magnet, wherein the ferromagnetic element comprises a plurality of ferromagnetic segments, and each of the ferromagnetic segments is positioned adjacent to another ferromagnetic segment of the plurality of ferromagnetic segments.

4. The system of claim 3, wherein each of the ferromagnetic segments is positioned adjacent to at least two ferromagnetic elements of the plurality of ferromagnetic elements.

5. The system of claim 1, wherein:
the system is a magnetic resonance imaging device,
the system further comprises a measurement volume having a measurement volume magnetic field strength and measurement volume magnetization direction,
the first magnet has a first magnetic field strength,
the second magnet has a second magnetic field strength, and
the measurement volume magnetic field strength and the measurement volume magnetization field direction is based on each of the first magnetic field strength, the first magnetization direction, the second magnetic field strength and the second magnetization direction.

6. The system of claim 1, wherein the first magnetization direction is different than the second magnetization direction.

7. The system of claim 6, wherein the first magnetization direction is substantially orthogonal to the second magnetization direction.

8. The system of claim 1, wherein each of the plurality of first magnetic segments has a substantially identical shape having two parallel faces, two opposite corners, and two opposite edges, and wherein the magnetization direction of each of the plurality of first magnetic segments is along one of:
an axis passing between two parallel faces,
an axis passing between the two opposite corners, and
an axis passing between the two opposite edges.

9. The system of claim 8, wherein each of the plurality of second magnetic segments has a substantially identical shape having two parallel faces, two opposite corners, and two opposite edges, and wherein the magnetization direction of each of the plurality of second magnetic segments is along one of:
- an axis passing between the two parallel faces,
- an axis passing between the two opposite corners, and
- an axis passing between the two opposite edges.

10. The system of claim 1, wherein the first magnet further comprises at least one fluid filled segment positioned adjacent to at least one of the plurality of first magnetic segments.

11. The system of claim 10, wherein:
- each of the plurality of first magnetic segments has a shape and size that are substantially identical,
- the at least one fluid filled segment has a shape and size,
- the shape of the at least one fluid filled segment is substantially identical to the shape of each of the plurality of first magnetic segments, and
- the size of the at least one fluid filled segment is substantially identical to the size of each of the plurality of first magnetic segments.

12. The system of claim 10, wherein the at least one fluid filled segment has a frame to support at least one adjacent first magnetic segment of the plurality of first magnetic segments.

13. The system of claim 1, wherein the magnetization direction of the at least one magnetic segment of the plurality of first magnetic segments is selected based on the position of the at least one magnetic segment in the first magnet.

14. The system of claim 13, wherein the magnetization direction of the at least one magnetic segment of the plurality of second magnetic segments is selected based on the position of the at least one magnetic segment in the second magnet.

15. The system of claim 1, wherein the magnetization direction of at least one magnetic segment of the plurality of first magnetic segments is selected based on the magnetization direction of at least one other magnetic segment of the plurality of first magnetic segments.

16. The system of claim 15, wherein the magnetization direction of at least one magnetic segment of the plurality of second magnetic segments is selected based on the magnetization direction of at least one other magnetic segment of the plurality of second magnetic segments.

17. The system of claim 1, wherein:
- the at least one magnetic segment of the plurality of first magnetic segments is adjacent to at least one magnetic segment of the plurality of second magnetic segments, and
- the magnetization direction of the at least one magnetic segment of the plurality of first magnetic segments is selected based on the magnetization direction of the at least one adjacent magnetic segment of the plurality of second magnetic segments.

18. The system of claim 17, wherein:
- the at least one magnetic segment of the plurality of second magnetic segments is adjacent to at least one magnetic segment of the plurality of first magnetic segments, and
- the magnetization direction of the at least one magnetic segment of the plurality of second magnetic segments is selected based on the magnetization direction of the at least one adjacent magnetic segment of the plurality of first magnetic segments.

19. The system of claim 1, further comprising:
a third magnet having a third magnetization direction, the third magnet being adjacent to the first magnet and the second magnet, and the third magnet comprising a plurality of third magnetic segments, wherein:
- each of the plurality of third magnetic segments is positioned adjacent to another third magnetic segment of the plurality of third magnetic segments,
- each of the plurality of third magnetic segments has a magnetization direction, and
- the magnetization direction of at least one magnetic segment of the plurality of third magnetic segments is different than the magnetization direction of at least one other magnetic segment of the plurality of third magnetic segments.

20. The system of claim 19, wherein each of the plurality of second magnetic segments is positioned adjacent to at least two second magnetic segments of the plurality of second magnetic segments.

21. The system of claim 20, wherein each of the plurality of third magnetic segments is positioned adjacent to at least two third magnetic segments of the plurality of third magnetic segments.

22. The system of claim 19, further comprising a ferromagnetic element adjacent to the first magnet, wherein the ferromagnetic element comprises a plurality of ferromagnetic segments, and each of the ferromagnetic segments is positioned adjacent to another ferromagnetic segment of the plurality of ferromagnetic segments.

23. The system of claim 22, wherein each of the ferromagnetic segments is positioned adjacent to at least two ferromagnetic elements of the plurality of ferromagnetic elements.

24. The system of claim 19, wherein:
- the system is a magnetic resonance imaging device,
- the system further comprises a measurement volume having a measurement volume magnetic field strength and measurement volume magnetization direction,
- the first magnet has a first magnetic field strength,
- the second magnet has a second magnetic field strength,
- the third magnet has a third magnetic field strength, and
- the measurement volume magnetic field strength and the measurement volume magnetization field direction is based on each of the first magnetic field strength, the first magnetization direction, the second magnetic field strength, the second magnetization direction, the third magnetic field strength, and the third magnetization direction.

25. The system of claim 19, wherein the first magnetization direction is different than the second magnetization direction and the third magnetization direction, and the second magnetization direction is different than the third magnetization direct.

26. The system of claim 25, wherein the first magnetization direction is substantially orthogonal to both the second magnetization direction and the third magnetization direction, and the second magnetization direction is substantially orthogonal to the third magnetization direct.

27. The system of claim 19, wherein:
each of the plurality of first magnetic segments has a substantially identical shape having two parallel faces, two opposite corners, and two opposite edges, and wherein the magnetization direction of each of the plurality of first magnetic segments is along one of:
- an axis passing between two parallel faces,
- an axis passing between the two opposite corners, and
- an axis passing between the two opposite edges;
each of the plurality of second magnetic segments has a substantially identical shape having two parallel faces, two opposite corners, and two opposite edges, and wherein the magnetization direction of each of the plurality of first magnetic segments is along one of:
an axis passing between two parallel faces,
an axis passing between the two opposite corners, and
an axis passing between the two opposite edges;
and
each of the plurality of third magnetic segments has a substantially identical shape having two parallel faces, two opposite corners, and two opposite edges, and wherein the magnetization direction of each of the plurality of third magnetic segments is along one of:
an axis passing between the two parallel faces,
an axis passing between the two opposite corners, and
an axis passing between the two opposite edges.

28. The system of claim 19, wherein:
the magnetization direction of the at least one magnetic segment of the plurality of first magnetic segments is selected based on the position of the at least one magnetic segment in the first magnet;
the magnetization direction of the at least one magnetic segment of the plurality of second magnetic segments is selected based on the position of the at least one magnetic segment in the second magnet;
the magnetization direction of the at least one magnetic segment of the plurality of third magnetic segments is selected based on the position of the at least one magnetic segment in the third magnet.

29. The system of claim 19, wherein:
the magnetization direction of at least one magnetic segment of the plurality of first magnetic segments is selected based on the magnetization direction of at least one other magnetic segment of the plurality of first magnetic segments;
the magnetization direction of at least one magnetic segment of the plurality of second magnetic segments is selected based on the magnetization direction of at least one other magnetic segment of the plurality of second magnetic segments; and
the magnetization direction of at least one magnetic segment of the plurality of third magnetic segments is selected based on the magnetization direction of at least one other magnetic segment of the plurality of third magnetic segments.

30. The system of claim 19, wherein:
the at least one magnetic segment of the plurality of first magnetic segments is adjacent to at least one magnetic segment of the plurality of second magnetic segments,
the magnetization direction of the at least one magnetic segment of the plurality of first magnetic segments is selected based on the magnetization direction of the at least one adjacent magnetic segment of the plurality of second magnetic segment,
the at least one magnetic segment of the plurality of second magnetic segments is adjacent to at least one magnetic segment of the plurality of first magnetic segments,
the magnetization direction of the at least one magnetic segment of the plurality of second magnetic segments is selected based on the magnetization direction of the at least one adjacent magnetic segment of the plurality of first magnetic segments,
the at least one magnetic segment of the plurality of third magnetic segments is adjacent to at least one magnetic segment of the plurality of second magnetic segments, and
the magnetization direction of the at least one magnetic segment of the plurality of third magnetic segments is selected based on the magnetization direction of the at least one adjacent magnetic segment of the plurality of second magnetic segments.

\* \* \* \* \*